United States Patent
Shao et al.

(10) Patent No.: US 10,991,332 B2
(45) Date of Patent: Apr. 27, 2021

(54) SHIFT-REGISTER CIRCUIT, A DRIVING METHOD THEREOF, AND RELATED DISPLAY APPARATUS

(71) Applicants: Hefei Xinsheng Optoelectronics Technology Co., Ltd., Anhui (CN); BOE Technology Group Co., Ltd., Beijing (CN)

(72) Inventors: Xibin Shao, Beijing (CN); Zhangtao Wang, Beijing (CN); Rui Ma, Beijing (CN); Tong Yang, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/614,486

(22) PCT Filed: Jan. 16, 2018

(86) PCT No.: PCT/CN2018/072818
§ 371 (c)(1),
(2) Date: Nov. 18, 2019

(87) PCT Pub. No.: WO2019/095548
PCT Pub. Date: May 23, 2019

(65) Prior Publication Data
US 2020/0202807 A1   Jun. 25, 2020

(30) Foreign Application Priority Data
Nov. 20, 2017   (CN) .......................... 201711160812.2

(51) Int. Cl.
*G09G 3/36* (2006.01)
*G09G 3/3266* (2016.01)

(52) U.S. Cl.
CPC ......... *G09G 3/3677* (2013.01); *G09G 3/3266* (2013.01); *G09G 2310/0286* (2013.01); *G09G 2310/061* (2013.01); *G09G 2330/027* (2013.01)

(58) Field of Classification Search
CPC .............. G09G 3/3677; G09G 3/3266; G09G 2310/0286; G09G 2310/061; G09G 2330/027
(Continued)

(56) References Cited

U.S. PATENT DOCUMENTS

2016/0055814 A1* 2/2016 Yang .................... G09G 3/3677
345/213

* cited by examiner

*Primary Examiner* — Abdul-Samad A Adediran
(74) *Attorney, Agent, or Firm* — Intellectual Valley Law, P.C.

(57) ABSTRACT

The present application discloses a shift-register circuit including a shift-register unit and a shutdown-discharge sub-circuit. The shift-register unit is coupled to a clock port, a first reference voltage port, a second reference voltage port, and an output port and configured to set a voltage level at a pull-up node to control a clock signal from the clock port being outputted to the output port to drive a display panel during a display period. The shutdown discharge sub-circuit is configured to at least simultaneously receive a shutdown signal at a first voltage level from a shutdown-discharge control port and a second signal at the first voltage level from the second reference voltage port to start a shutdown period to discharge at least one of the pull-up node and the output port. The shutdown signal has a signal length longer than a signal length of the second signal.

20 Claims, 5 Drawing Sheets

(58) Field of Classification Search
USPC .......................................................... 345/213
See application file for complete search history.

SHIFT-REGISTER CIRCUIT, A DRIVING METHOD THEREOF, AND RELATED DISPLAY APPARATUS

CROSS-REFERENCE TO RELATED APPLICATION

This application is a national stage application under 35 U.S.C. § 371 of International Application No. PCT/CN2018/072818 filed Jan. 16, 2018, which claims priority to Chinese Patent Application No. 201711160812.2, filed Nov. 20, 2017, the contents of which are incorporated by reference in the entirety.

TECHNICAL FIELD

The present invention relates to display technology, more particularly, to a shift-register circuit, a method for driving the shift-register circuit in a display panel, and a display apparatus thereof.

BACKGROUND

Most conventional flat panel displays adopt shift-register circuits to replace gate-driving chips to drive image display for reducing manufacture cost and production cycle time. When the flat panel display is shut down, it needs to release charges on all pixels to make the whole panel dark to avoid shutdown image abnormity. A conventional way to shut-down the display panel is to push all control signals inputted to the shift-register circuit to higher voltage level so that the voltage level at the output port also is pushed higher. Thus, all switch transistors connected to the pixel are turned on to release the charges therein. Because the power supply to the display panel has been cut after shutdown, all control signals that are inputted to the shift-register circuit will fall back to ground level. However, it is difficult to fully release the charges inside the shift-register circuit before all control signals fall back to the ground level. After multiple continuously switching on and off process, the non-released charges will result in abnormity in the shift-register circuit.

SUMMARY

In an aspect, the present disclosure provides a shift-register circuit for driving a display panel. The shift-register circuit includes a shift-register unit coupled to a clock port, a first reference voltage port, a second reference voltage port, and an output port. The shift-register unit is configured to receive a first signal at a first voltage level from the first reference voltage port and a second signal at a second voltage level from the second reference voltage port. The shift-register unit is configured to drive a display panel during a display period by setting a voltage level of a pull-up node based on the first signal and the second signal to control a clock signal being outputted from the clock port to the output port. The shift-register circuit further includes a shutdown-discharge sub-circuit coupled to a shutdown-discharge control port, the second reference voltage port, and at least one of the pull-up node and the output port. The shutdown-discharge sub-circuit is configured to receive a shutdown signal at the first voltage level from the shutdown-discharge control port and the second signal at the first voltage level from the second reference voltage port to start a shutdown period of the display panel. The shutdown-discharge sub-circuit is configured to discharge at least one of the pull-up node and the output port during the shutdown period. The shutdown signal at the first voltage level includes a signal duration longer than a signal duration of the second signal at the first voltage level.

Optionally, the shutdown discharge sub-circuit includes a first switch transistor and a second switch transistor. The first switch transistor includes a gate electrode coupled to the shutdown-discharge control port, a first electrode coupled to the second reference voltage port, and a second electrode coupled to the pull-up node. The second switch transistor includes a gate electrode coupled to the shutdown-discharge control port, a first electrode coupled to the second reference voltage port, and a second electrode coupled to the output port.

Optionally, each of the first switch transistor and the second switch transistor is an N-type transistor. The first voltage level is a switching-on voltage for the N-type transistor. The second voltage level is a switching-off voltage for the N-type transistor.

Optionally, each of the first switch transistor and the second switch transistor is a P-type transistor. The first voltage level is a switching-on voltage for the P-type transistor. The second voltage level is a switching-off voltage for the P-type transistor.

Optionally, the shift-register unit includes an input sub-circuit, a reset sub-circuit, an output sub-circuit, and a pull-down control sub-circuit. The input sub-circuit is coupled to the pull-up node, and configured to connect the input port to the pull-up node. The reset sub-circuit is coupled to the second reference voltage port and the pull-up node, and configured to connect the second reference voltage port to the pull-up node under control of a reset signal. The output sub-circuit is coupled to the clock port and the pull-up node, and configured to connect the clock port to the output port under control of the voltage level at the pull-up node. The pull-down control sub-circuit is coupled to the first reference voltage port, the pull-up node, and the second reference voltage port, and configured to connect the second reference voltage port to the pull-up node and the output port under control of the first signal from the first reference voltage port.

Optionally, the input sub-circuit includes a first transistor having a source electrode and a gate electrode both coupled to the input port and a drain electrode coupled to the pull-up node.

Optionally, the reset sub-circuit includes a second transistor having a gate electrode coupled to a reset port, a source electrode coupled to the pull-up node, and a drain electrode coupled to the second reference voltage port.

Optionally, the output sub-circuit includes a third transistor having a gate electrode coupled to the pull-up node, a source electrode coupled to the clock port, and a drain electrode coupled to the output port, and further includes a capacitor coupled between the gate electrode and the drain electrode.

Optionally, the pull-down control sub-circuit includes a first sub-circuit comprising six transistors configured to receive the first signal from the first reference voltage port, and a second sub-circuit having a same circuitry structure of the first sub-circuit configured to receive the first signal alternately in time from an alternate reference voltage port.

Optionally, the shift-register unit further includes a frame-ending control sub-circuit coupled to the output port, the pull-up node, a frame-ending control port, and the second reference voltage port. The frame-ending control sub-circuit is configured to connect the second reference voltage port to the pull-up node and the output port under control of a frame-ending signal applied to the frame-ending control port when the shutdown-discharge period starts.

Optionally, the frame-ending control sub-circuit includes two transistors having their gate electrodes commonly coupled to the frame-ending control port and their source electrodes commonly coupled to the second reference voltage port, a drain electrode of one of the two transistors is coupled to the pull-up node and a drain electrode of another of the two transistors is coupled to the output port.

Optionally, the frame-ending signal applied to the frame-ending control port includes a first voltage level having a signal duration substantially equal to the signal duration of the shutdown-discharge signal at the first voltage level applied to the shutdown-discharge control port and longer than the signal duration of the second signal at the first voltage level applied to the second reference voltage port.

In another aspect, the present disclosure provides a method of driving the shift-register circuit described herein. The method includes applying the first signal at the first voltage level to the first reference voltage port and applying the second signal at the second voltage level to the second reference voltage port. The method further includes applying a clock signal to the clock port and applying the shutdown signal at the second voltage level to the shutdown-discharge control port during a display period. Additionally, the method includes simultaneously setting the first signal at the first voltage level with a first signal duration applied to the first reference voltage port and the second signal at the first voltage level with a second signal duration applied to the second reference voltage port and the shutdown signal at the first voltage level with a third signal duration applied to the shutdown-discharge control port and the clock signal at the first voltage level with a fourth signal duration applied to the clock port. The third signal duration is longer than the second signal duration.

Optionally, in the shutdown-discharge period, the third signal duration is longer than a duration from the second reference voltage port being set to the first voltage level to the second reference voltage port being returned to a ground voltage level.

Optionally, in the shutdown-discharge period, the first signal duration is substantially equal to the third signal duration.

Optionally, in the shutdown-discharge period, the second signal duration is substantially equal to the fourth signal duration.

The shift-register unit further includes a frame-ending control sub-circuit coupled to the output port, the pull-up node, a frame-ending control port, and the second reference voltage port. Optionally, the method further includes, in the shutdown-discharge period, setting the first voltage level for the frame-ending signal with a fifth signal duration applied to the frame-ending control port to connect the second reference voltage port to the pull-up node and the output port. The fifth signal duration is substantially equal to the third signal duration.

In yet another aspect, the present disclosure provides a gate-on-array driving circuit including multiple shift-register circuits described herein that are cascaded in series.

In still another aspect, the present disclosure provides a display panel comprising an array of pixel circuits and a gate-on-array driving circuit described herein for driving the array of pixel circuits to emit light for displaying a frame of image in a display period of each operation cycle.

In further another aspect, the present disclosure provides a display apparatus including a display panel described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1A:
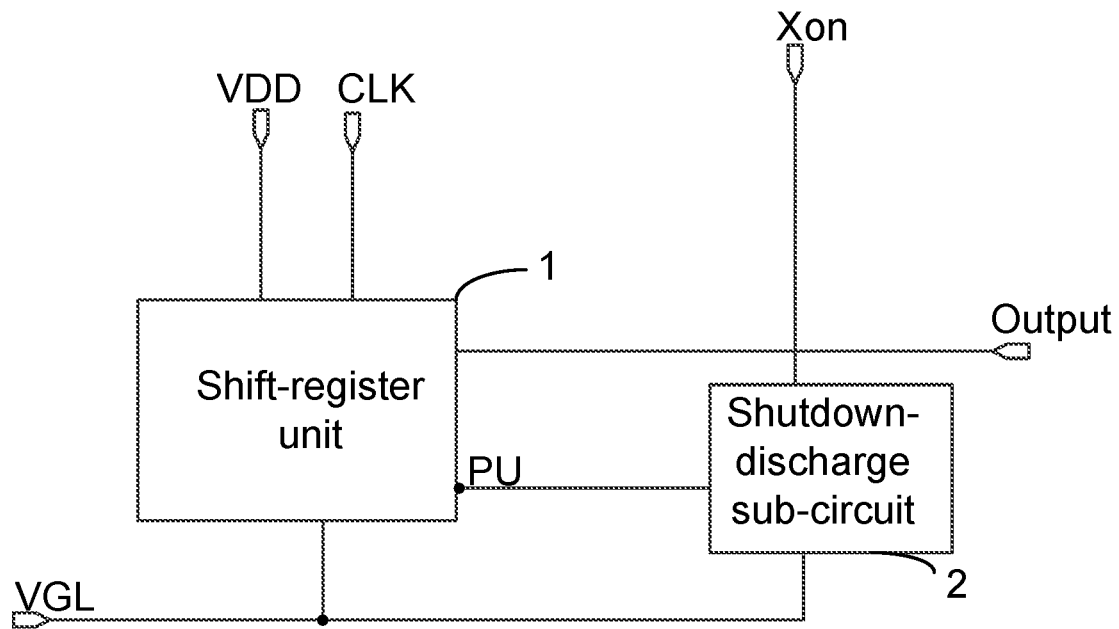
FIG. 1A through FIG. 1C are respective block diagrams of shift-register circuits according to some embodiments of the present disclosure.
Figure 1B:
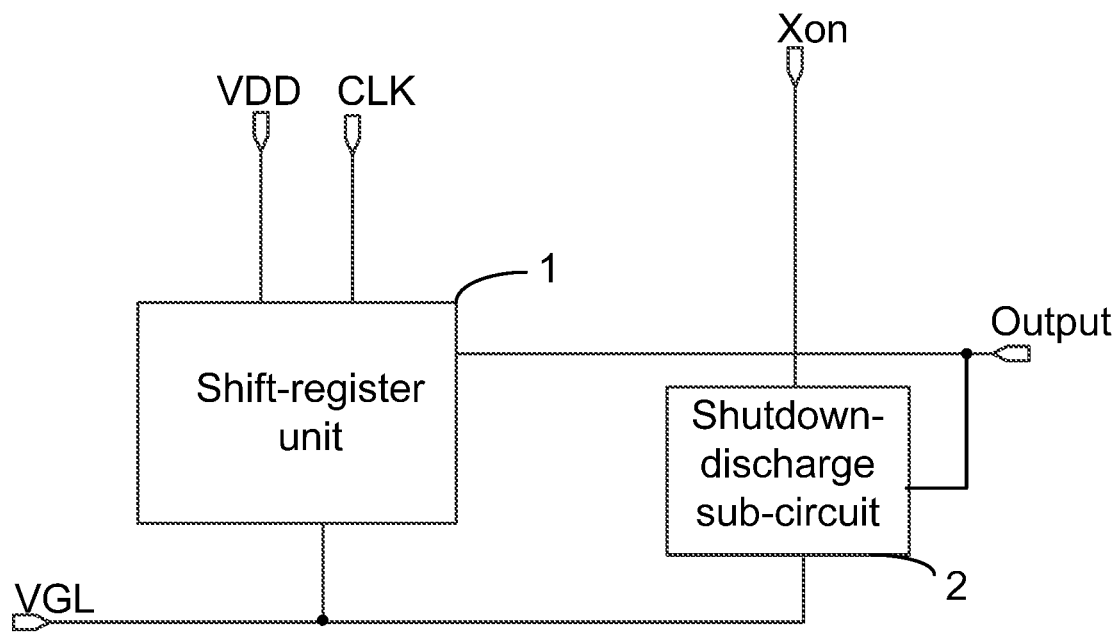
Figure 1C:
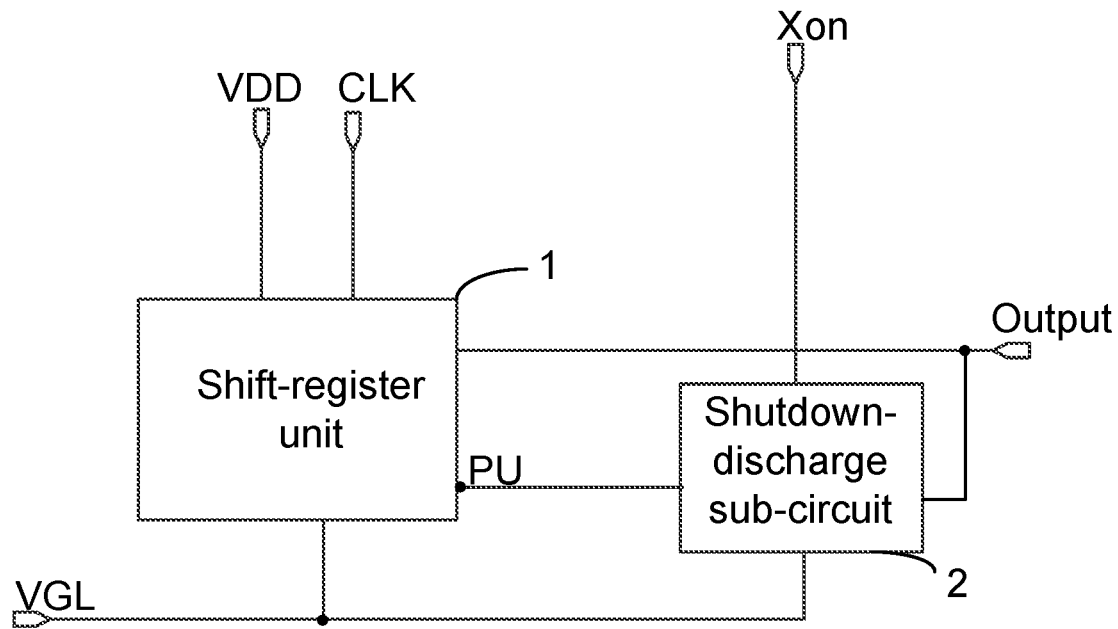

Accordingly, the present disclosure provides, inter alia, a shift-register circuit, a gate-on-array driving circuit based on the shift-register circuit, a display panel and a display apparatus having the same, and a driving method thereof that substantially obviate one or more of the problems due to limitations and disadvantages of the related art. In one aspect, the present disclosure provides a shift-register circuit. FIG. 1A through FIG. 1C are respective block diagrams of shift-register circuits according to some embodiments of the present disclosure. As shown, the shift-register circuit includes at least a shift-register unit 1 coupled to a clock port CLK, a first reference voltage port VDD, a second reference voltage port VGL, and an output port Output. In a display period of operating the display panel, the clock port CLK provides a clock signal that is alternately set to a first voltage level and a second voltage level. Optionally, the first voltage level can be a switch-on signal at a high voltage relative to the second voltage level as a switch-off signal. The first reference voltage port VDD provides a first signal fixed at the first voltage level. Optionally, the first reference voltage port VDD connects to a power supply. The second reference voltage port VGL provides a second signal fixed at the second voltage level. Optionally, the second reference voltage port is grounded. The shift-register unit 1 is configured, under control of the first signal at the first voltage level from the first reference voltage port VDD and the second signal at the second voltage level from the second reference voltage port VGL, to set a voltage level at a pull-up node PU in the shift-register unit 1 to control the clock signal from the clock port CLK being outputted to the output port Output to drive a display panel to display image during a display period. This is illustrated in a period t1 of the timing waveform diagram shown in FIG. 2.

Referring to FIGS. 1A, 1B, and 1C, the shift-register circuit also includes a shutdown-discharge sub-circuit 2 having an input terminal coupled at least one of the pull-up node PU and the output port Output of the shift-register unit 1, an output terminal coupled to the second reference voltage port VGL, and a control terminal coupled to a shutdown-discharge control port Xon. Any time when the display panel that is comprised of the shift-register circuit is turned off, i.e., the display period ends while entering a shutdown-discharge period. This is illustrated as a period t2 of the timing waveform diagram shown in FIG. 2. The shutdown-discharge sub-circuit 2 is configured to start the shutdown-discharge period t2 by at least receiving a shutdown signal from the shutdown-discharge control port Xon to discharge at least one of the pull-up node PU and the output port Output.

Referring to FIG. 1A, the shutdown-discharge sub-circuit 2 optionally has its input terminal coupled only to the pull-up node PU of the shift-register unit 1. In the shutdown-discharge period t2, the shutdown-discharge sub-circuit 2 is to discharge the pull-up node PU by connecting it to the ground through the second reference voltage port VGL to release any residual charges in the shift-register unit 1. Referring to FIG. 1B, the shutdown-discharge sub-circuit 2 optionally has its input terminal coupled only to the output port Output of the shift-register unit 1. In the shutdown-discharge period t2, the shutdown-discharge sub-circuit 2 is to discharge the output port Output by connecting it to the ground through the second reference voltage port VGL to release any residual charges in the shift-register unit 1. Optionally, referring to FIG. 1C, the shutdown-discharge sub-circuit 2 optionally has its input terminal coupled to both the pull-up node PU and the output port Output of the shift-register unit 1. In the shutdown-discharge period t2, the shutdown-discharge sub-circuit 2 is to discharge both the pull-up node PU and the output port Output by connecting them respectively to the ground through the second reference voltage port VGL to release any residual charges in the shift-register unit 1. By discharging at least one of the pull-up node PU and the output port Output performed by the shutdown-discharge sub-circuit 2, the shift-register unit 1 is ensured to be substantially free of residual charges so that the shift-register circuit can perform normally to drive the display panel for displaying image even after the display panel is subjected to multiple switching-on and shutting-down processes continuously. This makes the display panel much more reliable.

Figure 2:
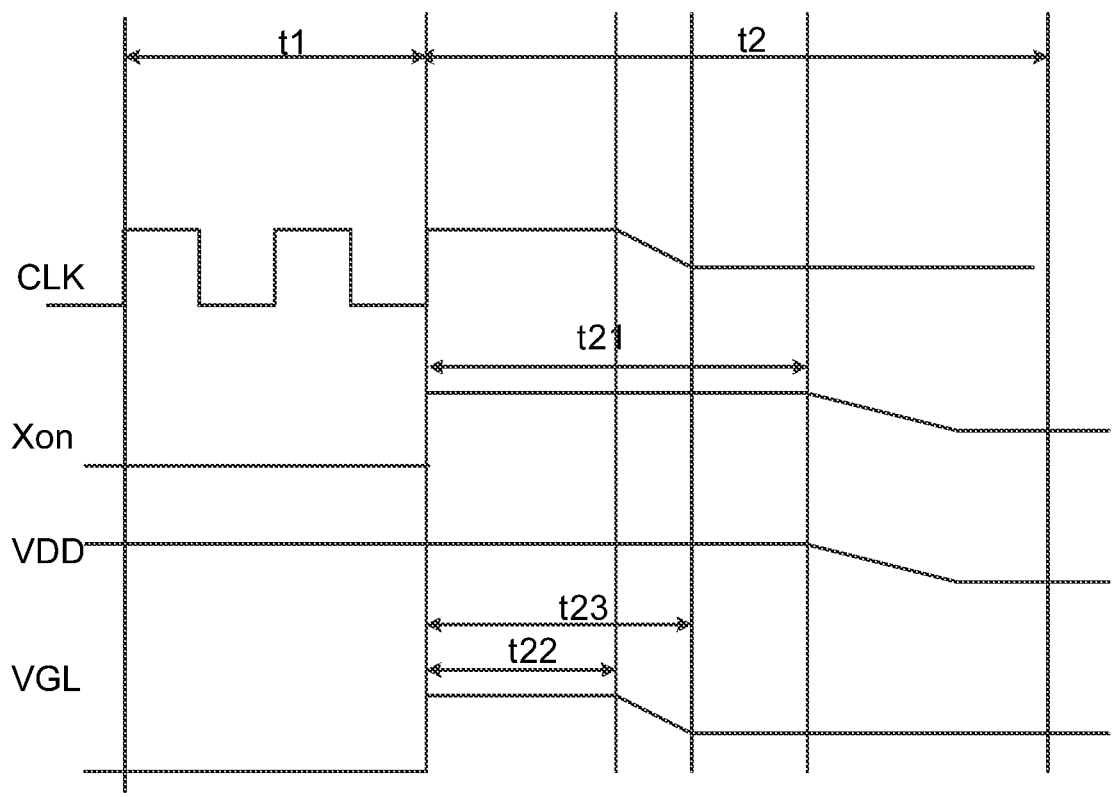
FIG. 2 is a signal timing waveform associated with a shift-register circuit in both a display period and a shutdown-discharge period after the display period according to an embodiment of the present disclosure.

FIG. 2 is a signal timing waveform associated with a shift-register circuit in both a display period and a shutdown-discharge period after the display period according to an embodiment of the present disclosure. Referring to FIG. 2, in the display period t1, the clock port provides a clock signal periodically at a first voltage level and a second voltage level. Optionally, the first voltage level is a high voltage level and the second voltage level is a low voltage level, as shown in the example of FIG. 2. The shutdown-discharge control port Xon provides a signal fixed at the low voltage level in the display period t1. The first reference voltage port VDD provides a first signal set to the high voltage level. The second reference voltage port VGL provides a second signal set to the low voltage level. Under control of all these signals, the shift-register unit 1 can be operated to output the clock signal to the output port Output for driving the display panel to display images in the display period t1.

At one moment when the display panel is shut down to finish the display period t1, a shutdown-discharge period t2 starts. Referring to FIG. 2, the shutdown-discharge period t2 starts with all signals applied to the shutdown-discharge control port Xon, the first reference voltage port VDD, the second reference voltage port VGL, and the clock port CLK, are simultaneously set to a first voltage level (a high voltage level in this embodiment) with respective signal durations. the shutdown signal applied to the shutdown-discharge control port Xon has a signal duration t21 and the second signal applied to the second reference voltage port VGL has a signal duration t22. In the embodiment, t21 is set to be greater than t22. Optionally, the signal duration t21 of the shutdown signal applied to the shutdown-discharge control port Xon is set to be longer than a duration t23 from a time point the second reference voltage port VGL being set to the first voltage level to another time point the second reference voltage port VGL being dropped to a ground level. In this way, it is ensured that during the time the voltage level at the second reference voltage port VGL is falling back to the ground level the shutdown-discharge sub-circuit 2 remains in a turned-on state to pull down the voltage level of at least one of the pull-up node PU and the output port Output to the ground level through their connection with the second reference voltage port VGL. This ensures substantially fully releasing of residual charges in the shift-register unit after the display panel is switched off to enter the period t2.

Figure 3:
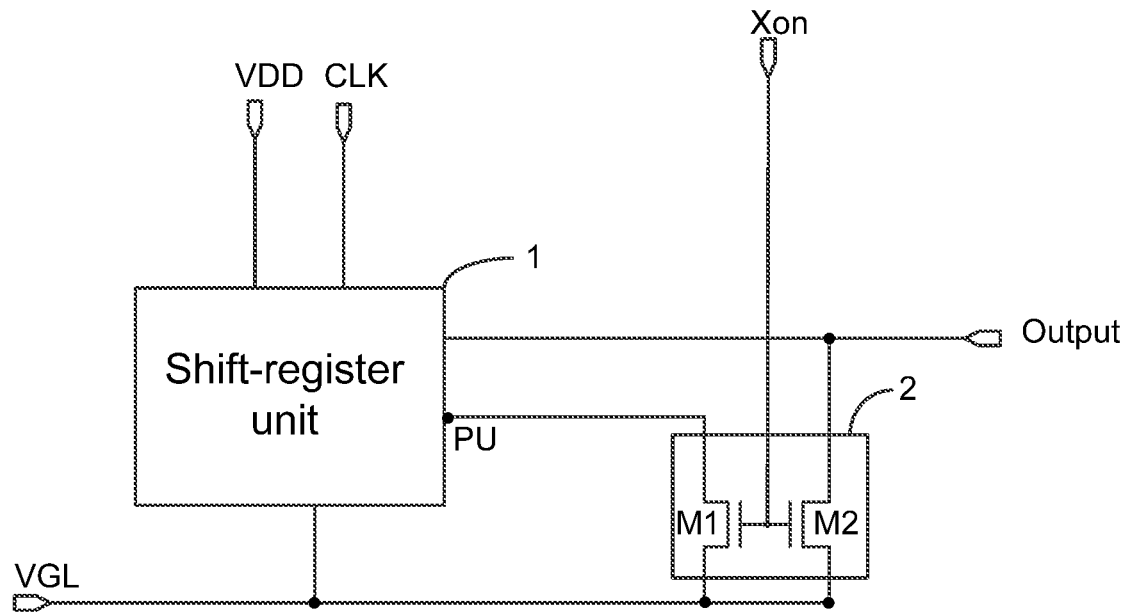
FIG. 3 is a schematic structural diagram of a shift-register circuit according to an embodiment of the present disclosure.

FIG. 3 is a schematic structural diagram of a shift-register circuit according to an embodiment of the present disclosure. Referring to FIG. 3, the shutdown-discharge sub-circuit 2 includes a first switch transistor M1 and a second switch transistor M2. The first switch transistor M1 includes a gate electrode coupled to the shutdown-discharge control port Xon, a source electrode coupled to the second reference voltage port VGL, and a drain electrode coupled to the pull-up node PU. The first switch transistor M1 is configured to discharge the pull-up node PU during the shutdown-discharge period t2. The second switch transistor M2 includes a gate electrode coupled to the shutdown-discharge control port Xon, a source electrode coupled to the second reference voltage port VGL, and a drain electrode coupled to the output port Output. The second switch transistor M2 is configured to discharge the output port Output during the shutdown-discharge period t2. Optionally, the shutdown-discharge sub-circuit 2 includes only one of the first switch transistor M1 and the second switch transistor M2.

Figure 5:
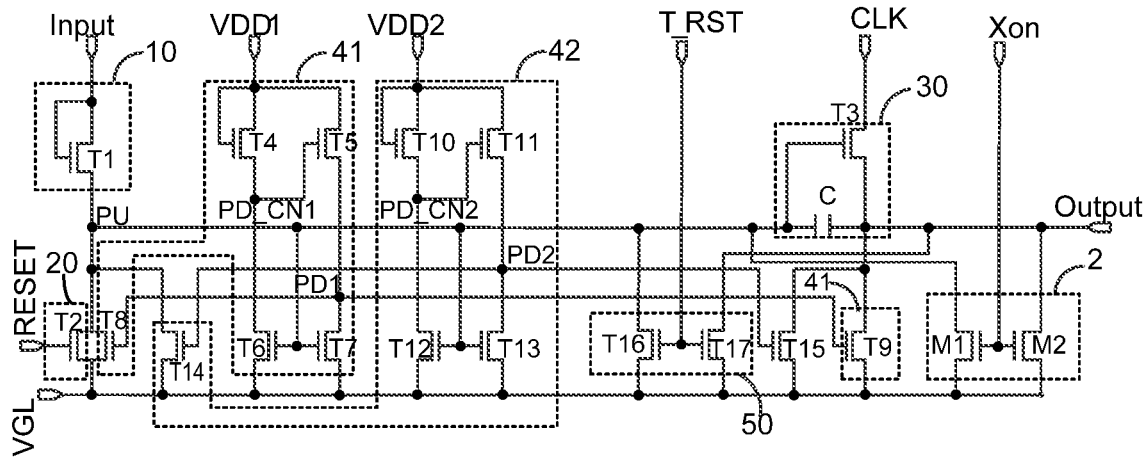
FIG. 5 is a circuit diagram of a shift-register circuit according to an embodiment of the present disclosure.

Optionally, all transistors in the shift-register unit 1 and the shutdown-discharge sub-circuit 2 including the first switch transistor M1 and the second switch transistor M2 are N-type transistors, as shown in FIG. 5. In this embodiment, during the shutdown-discharge period t2, the shutdown signal applied to the shutdown-discharge control port Xon is set to the first voltage level which is a high voltage level.

Figure 6:
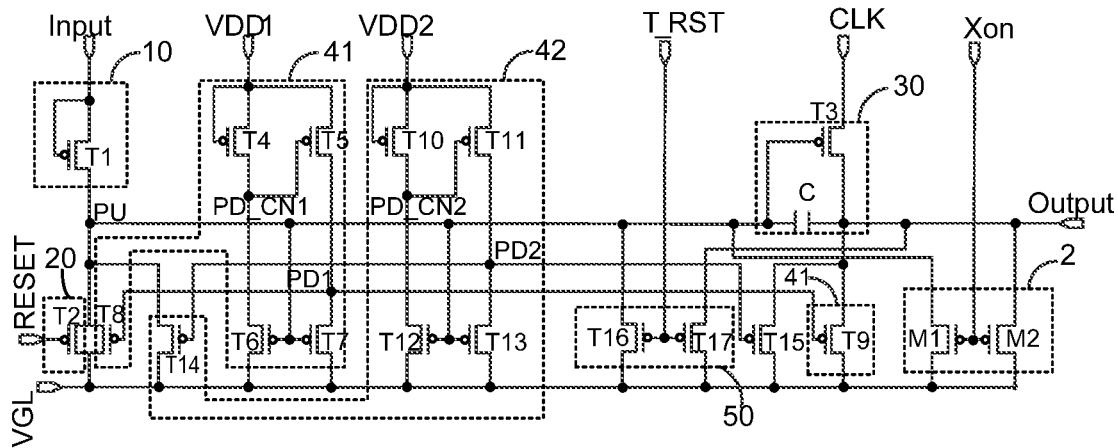
FIG. 6 is a circuit diagram of a shift-register circuit according to another embodiment of the present disclosure

Optionally, all transistors in the shift-register unit 1 and the shutdown-discharge sub-circuit 2 including the first switch transistor M1 and the second switch transistor M2 are P-type transistors, as shown in FIG. 6. In this embodiment, during the shutdown-discharge period t2, the shutdown signal applied to the shutdown-discharge control port Xon is set to the first voltage level which is a low voltage level.

Figure 4:
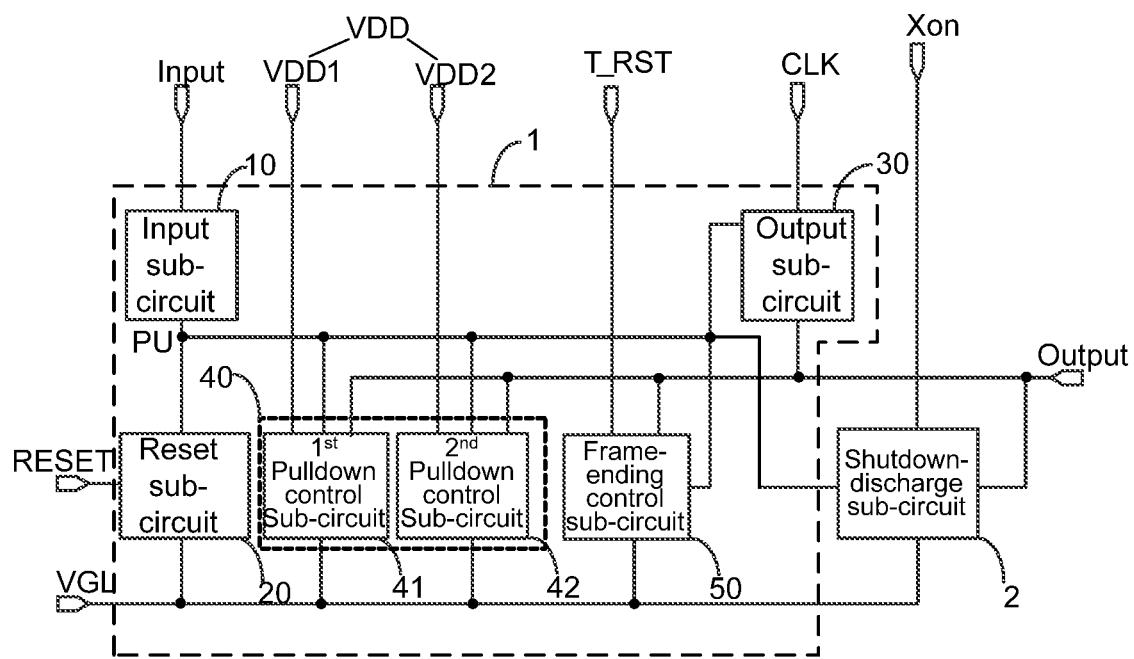
FIG. 4 is a modular diagram of a shift-register circuit according to some embodiments of the present disclosure.

Optionally, the shift-register unit 1 of the shift-register circuit can be configured in many ways to achieve its function of outputting a drive signal to the output port Output (specifically to one row of subpixel units) for drive the display panel to display image in the display period t1. In general, FIG. 4 shows a modular diagram of a shift-register circuit according to some embodiments of the present disclosure. Referring to FIG. 4, the shift-register unit 1 of the shift-register circuit includes at least an input sub-circuit 10, a reset sub-circuit 20, an output sub-circuit 30, and a pull-down control sub-circuit 40. Specifically, the input sub-circuit 10 is coupled to the pull-up node PU and configured to transmit a signal from the input port Input to the pull-up node PU. The reset sub-circuit 20 is coupled to the second reference voltage port VGL and the pull-up node PU. The reset sub-circuit 20 is configured, under control of a reset signal received from a reset port RESET, to transmit a second signal from the second reference voltage port VGL to the pull-up node PU.

Additionally, the output sub-circuit 30 is coupled to the clock port CLK, the pull-up node PU, and the output port Output. In the embodiment, the output sub-circuit 30 is configured, under control of the voltage level at the pull-up node PU, to transmit a clock signal from the clock port CLK to the output port Output. The pull-down control sub-circuit 40 is coupled to the first reference voltage port VDD, the pull-up node PU, and the second reference voltage port VGL. In the embodiment, the pull-down control sub-circuit 40 is configured, under control of a first signal provided at the first reference voltage port VDD, to transmit a second voltage signal provided from the second reference voltage port VGL respectively to the pull-up node PU and the output port Output.

Referring to FIG. 5 and FIG. 6, which are two specific examples of the shift-register circuit of FIG. 4, the input sub-circuit 10 includes a transistor T1 having a gate electrode and a source electrode commonly coupled to the input port Input and having a drain electrode coupled to the pull-up node PU. Optionally, the transistor T1 can be an N-type transistor (see FIG. 5) and is turned on when the input port Input is loaded with a high voltage signal. Optionally, the transistor T1 can be a P-type transistor (see FIG. 6) and is turned on when the input port Input is loaded with a low voltage signal.

Referring to FIG. 5 and FIG. 6, the reset sub-circuit 20 includes a transistor T2 having a gate electrode coupled to the reset port RESET, a source electrode coupled to the pull-up node PU, and a drain electrode coupled to the second reference voltage port VGL. Optionally, the transistor T2 can be an N-type transistor (see FIG. 5) and is turned on when a high voltage signal is loaded to the reset port RESET. Optionally, the transistor T2 can be a P-type transistor (see FIG. 6) and is turned on when a low voltage signal is loaded to the reset port RESET.

Referring to FIG. 5 and FIG. 6, the output sub-circuit 30 includes a transistor T3 and a capacitor C coupled between a gate electrode and a drain electrode of the transistor T3. The gate electrode of the transistor T3 is coupled to the pull-up node PU. A source electrode of the transistor T3 is coupled to the clock port CLK. The drain electrode of the transistor T3 is coupled to the output port Output. Optionally, the transistor T3 can be an N-type transistor (see FIG. 5) and is turned on when the voltage level of the pull-up node PU is at a high voltage level. Optionally, the transistor T2 can be a P-type transistor (see FIG. 6) and is turned on when voltage level of the pull-up node PU is at a low voltage level. Optionally, the capacitor C can be used to push the voltage level at the pull-up node PU further higher or pull down the voltage level even lower based on its bootstrapping effect when the pull-up node PU is in a floating state. Thus the capacitor C can keep the shift-register unit 1 to output a drive signal based on the clock signal provided to the clock port CLK at a proper voltage level to the output port Output. Additionally, adding the capacitor C also facilitates the reduction of noise (voltage) at either the pull-up node PU or the output port Output.

Optionally, as shown in FIG. 4, the pull-down control sub-circuit 40 includes two sub-circuits 41 and 42 having the same circuitry structure respectively coupled to the first reference voltage port VDD1 and an alternate reference voltage port VDD2 which are configured to provide the first signal alternately in time. In other words, the pull-down control sub-circuit 40 uses the first sub-circuit 41 and the second sub-circuit 42 alternatively in time to perform a same pull-down control function in the shift-register unit 1. This allows each sub-circuit's duty cycle to be reduced in half, prolonging working lift time of the shift-register unit.

In particular, the first sub-circuit 41 has a first terminal coupled to the first reference voltage port VDD1, a second terminal coupled to the second reference voltage port VGL, a third terminal coupled to the pull-up node PU, a fourth terminal coupled to a first pull-down node PD1, and a fifth terminal coupled to the output port Output. The first sub-circuit 41 is configured, under control of the first signal provided at the first reference voltage port VDD1, to control a voltage level at the first pull-down node PD1 to be at the first voltage level and to set a voltage level of the pull-up node PU and the output port Output to a same voltage level of the second signal applied to the second reference voltage port VGL.

Optionally, referring to FIG. 5 and FIG. 6, the first sub-circuit 41 includes transistor T4, transistor T5, transistor T6, transistor T7, transistor T8, and transistor T9. Specifically, transistor T4 has a gate electrode and a source electrode commonly coupled to the first reference voltage port VDD1 and a drain electrode coupled to a first node PD_CN1. The transistor T5 has a gate electrode coupled to the first node PD_CN1, a source electrode coupled to the first reference voltage port VDD1, and a drain electrode coupled to a first pull-down node PD1. The transistor T6 has a gate electrode coupled to the pull-up node PU, a source electrode coupled to the first node PD_CN1, and a drain electrode coupled to the second reference voltage port VGL. The transistor T7 has a gate electrode coupled to the pull-up node PU, a source electrode coupled to the first pull-down node PD1, and a drain electrode coupled to the second reference voltage port VGL. The transistor T8 has a gate electrode coupled to the first pull-down node PD1, a source electrode coupled to the pull-up node PU, and a drain electrode coupled to the second reference voltage port VGL. The transistor T9 has a gate electrode coupled to the first pull-down node PD1, a source electrode coupled to the output port Output, and drain electrode coupled to the second reference voltage port VGL. Optionally, each of these transistors T4, T5, T6, T7, T8, and T9 is an N-type transistor (FIG. 5). In this case, the first signal applied to the first reference voltage port VDD1 during the display period t1 is fixed at a high voltage level. Optionally, each of those transistors T4, T5, T6, T7, T8, and T9 is a P-type transistor (FIG. 6). In this case, the first signal applied to the first reference voltage port VDD1 during the display period t1 is fixed at a low voltage level.

Furthermore, referring to FIG. 5 and FIG. 6, the second sub-circuit 42 is substantially the same in circuitry structure as the first sub-circuit 41 and connection configuration with other sub-circuits and various ports for receiving control signals or various circuitry nodes for controlling the operation of the shift-register unit and the output port for outputting a drive signal to drive the display panel to display image. Specifically, the second sub-circuit 42 includes transistors T10, T11, T12, T13, T14, and T15, performing a same function as the first sub-circuit 41 alternatively in time.

Optionally, as shown in FIG. 4, the shift-register unit 1 further includes a frame-ending control sub-circuit 50 coupled respectively to the output port Output, the pull-up node PU, a frame-ending control port T_RST, and the second reference voltage port VGL. In particular, the frame-ending control sub-circuit 50 is configured, under control of a frame-ending signal provided at the frame-ending control port T_RST, to connect the second reference voltage port VGL to the pull-up node PU and the output port Output. In general, the frame-ending control port T_RST provides an effective signal (or switch-on signal) when the display period t1 ends to control the frame-ending control sub-circuit 50 to perform its function to pull down the voltage level of the pull-up node PU and the output port Output to that (ground level) of the second reference voltage port VGL.

Referring to FIG. 5 and FIG. 6, the frame-ending control sub-circuit 50 includes a transistor T16 and another transistor T17. In the embodiment, transistor T16 has a gate electrode coupled to the frame-ending control port T_RST, a source electrode coupled to the second reference voltage port VGL, and a drain electrode coupled to the pull-up node PU. The transistor T17 has a gate electrode coupled to the frame-ending control port T_RST, a source electrode coupled to the second reference voltage port VGL, and a drain electrode coupled to the output port Output. Optionally, each of the transistors T16 and T17 is an N-type transistor (FIG. 5). In this case, when the frame-ending control port T_RST is loaded with a high voltage signal, T16 and T17 are turned on. Optionally, each of the transistors T16 and T17 is a P-type transistor (FIG. 6). In this case, when the frame-ending control port T_RST is loaded with a low voltage signal, T16 and T17 are turned on.

Optionally, in the shift-register circuit of the present disclosure, the first switch transistor M1 and the second switch transistor M2 in the shutdown-discharge sub-circuit 2 is formed with a size larger than that of all transistors contained in the shift-register unit 1. The discharging function of the shift-register circuit in the shutdown-discharge period t2 is mainly executed by the first switch transistor M1 and the second switch transistor M2. Optionally, the switch transistor is made from a thin-film transistor. Optionally, the switch transistor is made from a metal-oxide-semiconductor field-effect transistor.

In another aspect, the present disclosure provides a method of driving the shift-register circuit described herein. Referring to the timing waveform shown in FIG. 2, in the display period t1, the method of driving the shift-register circuit includes for the shift-register unit applying a first signal at the first voltage level to the first reference voltage port VDD, applying a second signal at the second voltage level to the second reference voltage port VGL, and applying a clock signal to the clock port CLK; for the shutdown-discharge sub-circuit applying the shutdown signal at the second voltage level to the shutdown-discharge control port Xon. Further, when starting the shutdown-discharge period t2, the method of driving the shift-register circuit includes simultaneously setting a first signal at the first voltage level with a first signal duration applied to the first reference voltage port VDD, the second signal at the first voltage level with a second signal duration applied to the second reference voltage port VGL, the shutdown signal at the first voltage level with a third signal duration applied to the shutdown-discharge control port Xon, and the clock signal at the first voltage level with the fourth signal duration provided to the clock port CLK. In particular, the third signal duration t21 of the shutdown signal applied to the shutdown-discharge control port Xon is set to be longer than the second signal duration t22 of the second signal applied to the second reference voltage port VGL.

In particular, when executing the method in the shutdown-discharge period t2, by setting the third signal duration t21 to be longer than the second signal duration t22, the residual charges in the shift-register unit 1 can be effectively released substantially fully. This method ensures the shift-register unit to perform normal function of driving the display panel to display image after the display panel is subjected switching-on or shutting-down operations multiple times.

In a specific embodiment, in the shutdown-discharge period t2, setting the third signal duration t21 of applying the shutdown signal at the first voltage level to the shutdown-discharge control port Xon to be longer than the second signal duration t22 of applying the second signal at the first voltage level to the second reference voltage port VGL allows duration of making the shutdown-discharge sub-circuit 2 in a conduction state to be greater than t22. This method ensures that the shutdown-discharge sub-circuit 2 remains at the conduction state after the voltage level at the second reference voltage port VGL falls from the first voltage level to ground level. Since the input terminal of the shutdown-discharge sub-circuit 2 is connected to at least one of the pull-up node PU and the output port Output, this method ensures that at least one of the of the pull-up node PU and the output port Output can be pulled down to the ground level to release charges in the shift-register unit 1. The discharge process allows substantially all residual charges to be released after the display panel is shut down. This ensures the shift-register circuit to be able to work normally after the display panel is started again.

Optionally, referring to FIG. 2, in the shutdown-discharge period t2, the third signal duration t21 is set to be greater than a duration t23 starting from the second reference voltage port VGL being set to the first voltage level to the second reference voltage port VGL being pulled back to the ground level. In particular, when t21>t23, it is ensured that the shutdown-discharge sub-circuit 2 remains in the conduction state even after the second reference voltage port VGL has fallen back to the ground level from the first voltage level at the beginning of t2. Therefore, the voltage level at least at one of the pull-up node PU and the output port Output can be pulled down to the ground level to discharge the one of the pull-up node PU and the output port Output aiming to release residual charges fully in the shift-register unit 1 after the display panel is shut down. In turn, the shift-register circuit with substantially free of residual charges can work normally after the display panel restarts with enhanced reliability, even after going through switching on/off processes multiple times.

Optionally, referring to FIG. 2, in the shutdown-discharge period t2, the first signal duration of applying the first signal with the first voltage level to the first reference voltage port VDD can be set to substantially equal to the third signal duration t21 of applying the shutdown signal applied to the shutdown-discharge control port Xon. In particular, this allows the pull-down control sub-circuit 40 and the shutdown-discharge sub-circuit 2 to be in conduction states relatively synchronized. The pull-down control sub-circuit 40 and the shutdown-discharge sub-circuit 2 can discharge the pull-up node PU substantially at the same time. This allows acceleration of charge releasing process and ensures the shift-register unit 1 substantially free of residual charges after the display panel is shut down. In turn, this further ensures that the shift-register circuit to be functional normally to drive the display panel to display image again, enhancing reliability of the display panel.

Optionally, referring to FIG. 2, in the shutdown-discharge period t2, the fourth signal duration of setting the clock signal at the first voltage level to the clock port CLK can be set to substantially equal to the second signal duration t22 of applying the second signal at the first voltage level to the second reference voltage port VGL. In a specific embodiment, setting the fourth signal duration to be substantially equal to the second signal duration t22 allows the output sub-circuit 30 and the shutdown-discharge sub-circuit 2 can discharge the output port Output substantially at the same time. This allows acceleration of charge releasing process and ensures the shift-register unit 1 substantially free of residual charges after the display panel is shut down. In turn, this further ensures that the shift-register circuit to be functional normally to drive the display panel to display image again, enhancing reliability of the display panel.

Figure 7:
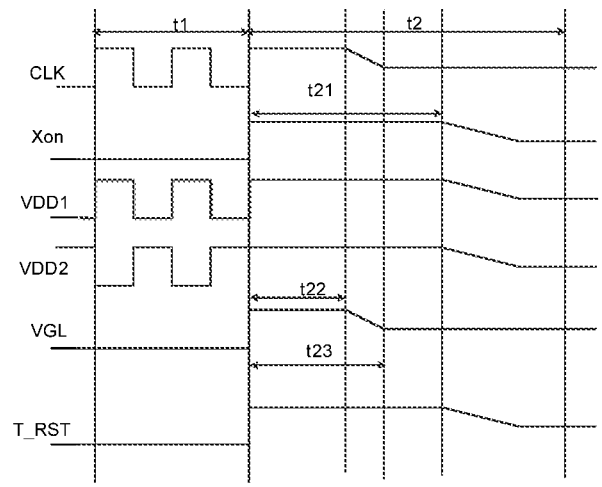
FIG. 7 is a timing waveform of operating the shift-register circuit of FIG. 5 in both a display period and a shutdown-discharge period after the display period according to an embodiment of the present disclosure.

FIG. 7 is a timing waveform of operating the shift-register circuit of FIG. 5 in both a display period and a shutdown-discharge period after the display period according to an embodiment of the present disclosure. Referring to FIG. 7, the method of driving the shift-register circuit also includes, when starting the shutdown-discharge period t2, applying a frame-ending signal at the first voltage level to the frame-ending control port T_RST with a fifth signal duration substantially equal to the third signal duration t21 of applying the shutdown signal at the first voltage level to the shutdown-discharge control port Xon. In particular, setting the fifth signal duration equal to the third signal duration t21 allows both the frame-ending control sub-circuit 50 and the shutdown-discharge sub-circuit 2 to be set to a conduction state substantially at the same time. Therefore, the frame-ending control sub-circuit 50 and the shutdown-discharge sub-circuit 2 can simultaneously discharge the pull-up node PU and the output port Output. This allows acceleration of charge releasing and ensures the shift-register unit 1 substantially free of residual charges after the display panel is shut down. In turn, this further ensures that the shift-register circuit to be functional normally to drive the display panel to display image again, enhancing reliability of the display panel.

Figure 8:
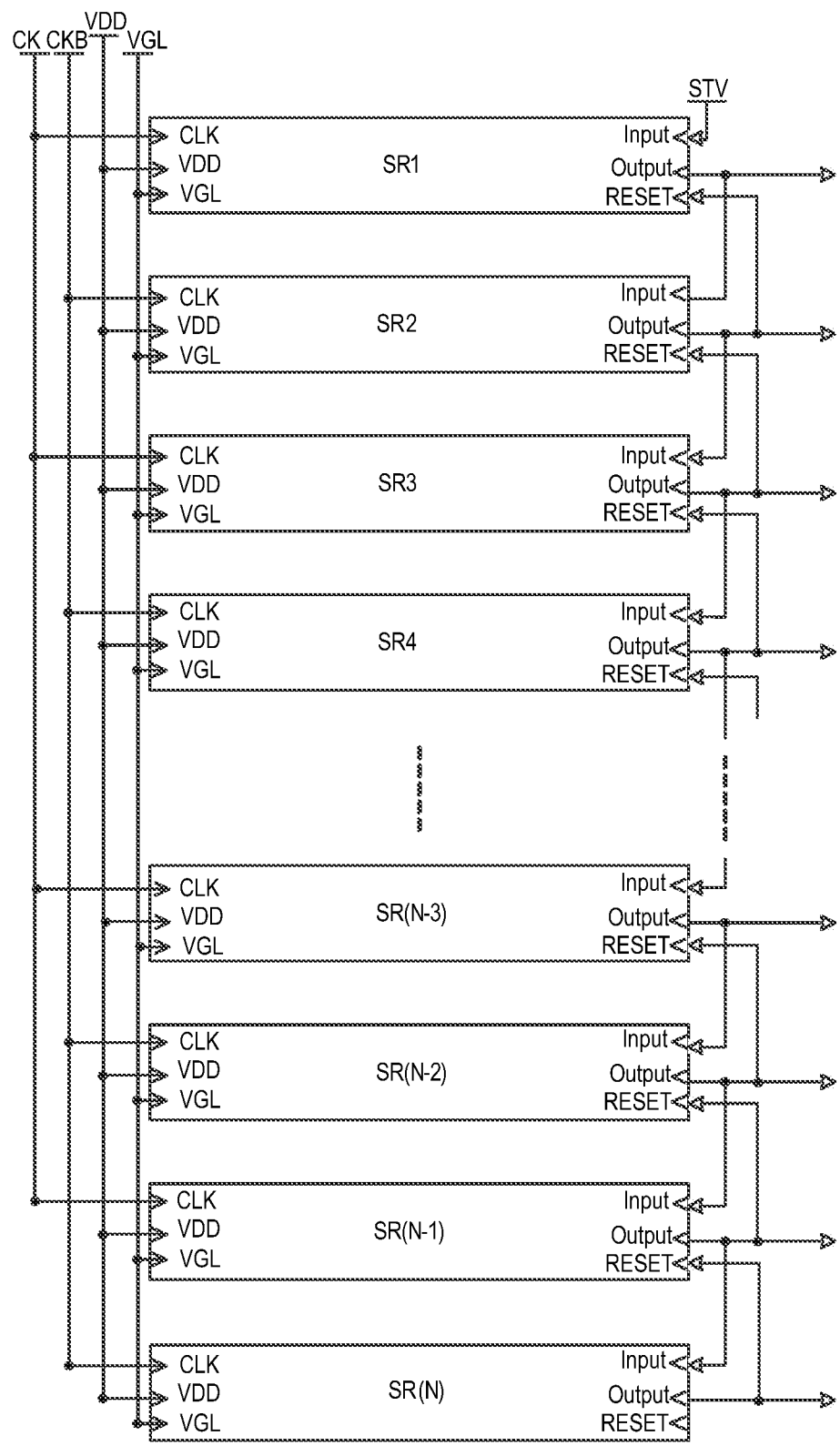
FIG. 8 is a gate-on-array driving circuit according to an embodiment of the present disclosure.

In yet another aspect, the present disclosure also provides a gate-on-array driving circuit. As shown in FIG. 8 in an example, the gate-on-array driving circuit is comprised of multiple shift-register circuits being cascaded in a multi-stage series including, for example, SR(1), SR(2), . . . , SR(n), . . . , SR(N−1), SR(N), total N number of shift-register circuits with 1≤n≤N. In general, the first stage shift-register circuit SR(1) is configured to receive an input signal from a start signal line STV. Except the first stage, each stage shift-register circuit SR(n) has an input port Input n configured to receive a signal from an output port Output_n−1 of a previous stage shift-register circuit SR(n−1). Each stage shift-register circuit SR(n) is substantially the same as that shown in one of FIG. 1A, FIG. 1B, FIG. 1C, FIG. 3, FIG. 4, FIG. 5, and FIG. 6.

In still another aspect, the present disclosure provides a display apparatus including the gate-on-array driving circuit described above. The gate-on-array driving circuit is configured to provide drive signals scanned through respective multiple rows of gate lines in the array substrate of the display apparatus. The display apparatus can be one of liquid crystal display panel, electronic paper, OLED display panel, AMOLED display panel, smart phone, tablet computer, TV, displayer, notebook computer, digital picture frame, navigator, and any product or component having a display function.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A shift-register circuit comprising:
a shift-register unit coupled to a clock port, a first reference voltage port, a second reference voltage port, and an output port, the shift-register unit being configured to receive a first signal at a first voltage level from the first reference voltage port and a second signal at a second voltage level from the second reference voltage port, the shift-register unit being configured to drive a display panel during a display period by setting a voltage level of a pull-up node based on the first signal and the second signal to control a clock signal being outputted from the clock port to the output port;
a shutdown-discharge sub-circuit coupled to a shutdown-discharge control port, the second reference voltage port, and at least one of the pull-up node or the output port, the shutdown-discharge sub-circuit being configured to receive a shutdown signal at the first voltage level from the shutdown-discharge control port and the second signal at the first voltage level from the second reference voltage port to start a shutdown-discharge period of the display panel, the shutdown-discharge sub-circuit being configured to discharge the at least one of the pull-up node or the output port during the shutdown-discharge period, wherein the shutdown signal at the first voltage level comprises a signal duration longer than a signal duration of the second signal at the first voltage level.

2. The shift-register circuit of claim 1, wherein the shutdown-discharge sub-circuit comprises a first switch transistor and a second switch transistor, the first switch transistor comprises a gate electrode coupled to the shutdown-discharge control port, a first electrode coupled to the second reference voltage port, and a second electrode coupled to the pull-up node, and the second switch transistor comprises a gate electrode coupled to the shutdown-discharge control port, a first electrode coupled to the second reference voltage port, and a second electrode coupled to the output port.

3. The shift-register circuit of claim 2, wherein each of the first switch transistor and the second switch transistor is an N-type transistor; the first voltage level being a switching-on voltage for the N-type transistor; the second voltage level being a switching-off voltage for the N-type transistor.

4. The shift-register circuit of claim 2, wherein each of the first switch transistor and the second switch transistor is a P-type transistor; the first voltage level being a switching-on voltage for the P-type transistor; the second voltage level being a switching-off voltage for the P-type transistor.

5. The shift-register circuit of claim 1, wherein the shift-register unit comprises an input sub-circuit, a reset sub-circuit, an output sub-circuit, and a pull-down control sub-circuit; the input sub-circuit is coupled to the pull-up node, and configured to connect an input port to the pull-up node; the reset sub-circuit is coupled to the second reference voltage port and the pull-up node, and configured to connect the second reference voltage port to the pull-up node under control of a reset signal; the output sub-circuit is coupled to the clock port and the pull-up node, and configured to connect the clock port to the output port under control of the voltage level at the pull-up node; and the pull-down control sub-circuit is coupled to the first reference voltage port, the pull-up node, and the second reference voltage port, and configured to connect the second reference voltage port to the pull-up node and the output port under control of the first signal from the first reference voltage port.

6. The shift-register circuit of claim 5, wherein the input sub-circuit comprises a first transistor having a source electrode and a gate electrode both coupled to the input port and a drain electrode coupled to the pull-up node.

7. The shift-register circuit of claim 5, wherein the reset sub-circuit comprises a second transistor having a gate electrode coupled to a reset port, a source electrode coupled to the pull-up node, and a drain electrode coupled to the second reference voltage port.

8. The shift-register circuit of claim 5, wherein the output sub-circuit comprises a third transistor having a gate electrode coupled to the pull-up node, a source electrode coupled to the clock port, and a drain electrode coupled to the output port, and further comprises a capacitor coupled between the gate electrode and the drain electrode.

9. The shift-register circuit of claim 5, wherein the pull-down control sub-circuit comprises a first sub-circuit comprising six transistors configured to receive the first signal from the first reference voltage port, and a second sub-circuit having a same circuitry structure of the first sub-circuit configured to receive the first signal alternately in time from an alternate reference voltage port.

10. The shift-register circuit of claim 5, wherein the shift-register unit further comprises a frame-ending control sub-circuit coupled to the output port, the pull-up node, a frame-ending control port, and the second reference voltage port; and the frame-ending control sub-circuit is configured to connect the second reference voltage port to the pull-up node and the output port under control of a frame-ending signal applied to the frame-ending control port when the shutdown-discharge period starts.

11. The shift-register circuit of claim 10, wherein the frame-ending control sub-circuit comprises two transistors having their gate electrodes commonly coupled to the frame-ending control port and their source electrodes commonly coupled to the second reference voltage port, a drain electrode of one of the two transistors is coupled to the pull-up node and a drain electrode of another of the two transistors is coupled to the output port.

12. The shift-register circuit of claim 10, wherein the frame-ending signal applied to the frame-ending control port comprises a first voltage level having a signal duration substantially equal to the signal duration of the shutdown signal at the first voltage level applied to the shutdown-discharge control port and longer than the signal duration of the second signal at the first voltage level applied to the second reference voltage port.

13. A gate-on-array driving circuit comprising multiple shift-register circuits of claim 1 cascaded in series.

14. A display panel comprising an array of pixel circuits and a gate-on-array driving circuit of claim 13 for driving the array of pixel circuits to emit light for displaying a frame of image in a display period of each operation cycle.

15. A display apparatus comprising a display panel of claim 14.

16. A method of driving a shift-register circuit, comprising:
coupling a shift-register unit to a clock port, a first reference voltage port, a second reference voltage port, and an output port,
coupling a shutdown-discharge sub-circuit to a shutdown-discharge control port, the second reference voltage port, and at least one of a pull-up node or the output port;
receiving, by the shift-register unit, a first signal at a first voltage level from the first reference voltage port and a second signal at a second voltage level from the second reference voltage port;
setting, by the shift-register unit, a voltage level of the pull-up node based on the first signal and the second signal to control a clock signal being outputted from the clock port to the output port during a display period in a display panel;
receiving, by the shutdown-discharge sub-circuit, a shutdown signal at the first voltage level from the shutdown-discharge control port and the second signal at the first voltage level from the second reference voltage port to start a shutdown-discharge period of the display panel,
discharging, by the shutdown-discharge sub-circuit, the at least one of the pull-up node or the output port during the shutdown-discharge period, wherein the shutdown signal at the first voltage level comprises a signal duration longer than a signal duration of the second signal at the first voltage level;
applying the first signal at the first voltage level to the first reference voltage port, applying the second signal at the second voltage level to the second reference voltage port, applying a clock signal to the clock port, and applying the shutdown signal at the second voltage level to the shutdown-discharge control port during a display period; and
simultaneously setting the first signal at the first voltage level with a first signal duration applied to the first reference voltage port, the second signal at the first voltage level with a second signal duration applied to the second reference voltage port, the shutdown signal at the first voltage level with a third signal duration applied to the shutdown-discharge control port, and the clock signal at the first voltage level with a fourth signal duration applied to the clock port, wherein the third signal duration is longer than the second signal duration.

17. The method of claim 16, wherein, in the shutdown-discharge period, the third signal duration is longer than a duration from the second reference voltage port being set to the first voltage level to the second reference voltage port being returned to a ground voltage level.

18. The method of claim 16, wherein, in the shutdown-discharge period, the first signal duration is substantially equal to the third signal duration.

19. The method of claim 16, wherein, in the shutdown-discharge period, the second signal duration is substantially equal to the fourth signal duration.

20. The method of claim 16, wherein the shift-register unit further comprises a frame-ending control sub-circuit coupled to the output port, the pull-up node, a frame-ending control port, and the second reference voltage port, the method further comprising, in the shutdown-discharge period, setting the first voltage level for a frame-ending signal with a fifth signal duration applied to the frame-ending control port to connect the second reference voltage port to the pull-up node and the output port, wherein the fifth signal duration is substantially equal to the third signal duration.

* * * * *